(12) United States Patent
Egawa

(10) Patent No.: US 8,435,839 B2
(45) Date of Patent: May 7, 2013

(54) METHOD OF MANUFACTURING SEMICONDUCTOR DEVICE AND THE SEMICONDUCTOR DEVICE

(75) Inventor: Yoshimi Egawa, Tokyo (JP)

(73) Assignee: Lapis Semiconductor Co., Ltd., Yokohama (JP)

(*) Notice: Subject to any disclaimer, the term of this patent is extended or adjusted under 35 U.S.C. 154(b) by 14 days.

(21) Appl. No.: 12/320,316

(22) Filed: Jan. 23, 2009

(65) Prior Publication Data

US 2009/0209062 A1 Aug. 20, 2009

(30) Foreign Application Priority Data

Feb. 15, 2008 (JP) ................. 2008-034342

(51) Int. Cl.
*H01L 21/00* (2006.01)

(52) U.S. Cl.
USPC ............ 438/127; 438/126; 257/E21.502; 257/E21.503

(58) Field of Classification Search .......... 438/108, 438/109, 126, 127; 257/686, 777, 778, E21.502, 257/E21.503
See application file for complete search history.

(56) References Cited

U.S. PATENT DOCUMENTS

| | | | | |
|---|---|---|---|---|
| 7,256,066 B2 * | 8/2007 | Chen et al. | ..... | 438/106 |
| 2002/0081771 A1 * | 6/2002 | Ding et al. | ..... | 438/108 |
| 2002/0125565 A1 * | 9/2002 | Naka et al. | ..... | 257/723 |

FOREIGN PATENT DOCUMENTS

| | | |
|---|---|---|
| JP | 05-055633 | 3/1993 |
| JP | 2001-110845 | 4/2001 |
| JP | 2001-127245 | 5/2001 |
| JP | 2001127245 A * | 5/2001 |
| JP | 2001-332685 | 11/2001 |
| JP | 2002-26236 | 1/2002 |
| JP | 2002-319647 | 10/2002 |
| JP | 2003-60156 | 2/2003 |
| JP | 2003-258189 | 9/2003 |
| JP | 2004-55609 | 2/2004 |
| JP | 2006-203470 | 8/2006 |
| JP | 2007-27381 | 2/2007 |
| JP | 2007-29424 | 2/2007 |
| WO | WO 98/40915 | 9/1998 |

\* cited by examiner

*Primary Examiner* — Daniel Whalen
(74) *Attorney, Agent, or Firm* — Rabin & Berdo, P.C.

(57) ABSTRACT

A method of manufacturing a semiconductor device which can reduce the number of times of resin-injection, thereby facilitating the miniaturization of the semiconductor device, and the semiconductor device. After resin is injected into a space between at least two second semiconductor chips flip-chip joined to a first semiconductor chip through an injection opening, the resin is hardened.

10 Claims, 5 Drawing Sheets

METHOD OF MANUFACTURING SEMICONDUCTOR DEVICE AND THE SEMICONDUCTOR DEVICE

BACKGROUND OF THE INVENTION

1. Field of the Invention

The present invention relates to a method of manufacturing a semiconductor device, and the semiconductor device.

2. Description of the Related Art

As the digital network information society rapidly develops, correspondingly handheld information terminals such as cellular phones and portable laptop PCs become higher in performance and functionality and smaller in size at accelerated rates, and there has been a demand for further improvement in information processing speed of servers connected to the handheld information terminals due to the increase in the amount of information.

As technology to meet the demand, the importance of LSI technology and mounting technology for connecting LSIs is increasing. For the handheld information terminals, demand on technology to realize three-dimensional lamination of semiconductor chips or packaged semiconductor chips is increasing.

An example of the three-dimensional lamination is to lay on a first semiconductor chip a second semiconductor chip smaller than the first semiconductor chip with connecting them electrically using a chip-on-chip (COC) technique. The first semiconductor chip and the second semiconductor chip are joined partially only at their terminals by bond material. Thus, the joint strength is weak because the first semiconductor chip and the second semiconductor chip are connected at a plurality of points, and there is the problem that the bond material cracks in an environmental test such as thermal shock.

To solve this problem, by filling a resin between the first semiconductor chip and the second semiconductor chip, they can be joined at faces, thereby increasing the joint strength.

The injection of a resin is disclosed in, e.g., Japanese Patent Kokai No. H05-55633 (patent document 1).

Patent document 1 discloses laying two second semiconductor chips on a first semiconductor chip and thereafter injecting a resin from one end of either of the second semiconductor chips with use of a dispenser.

OBJECTS AND SUMMARY OF THE INVENTION

However, with the injection of a resin disclosed in Reference 1, in order to make the resin reach to under the other semiconductor chip (on the other side from where the resin is injected), the resin has to be injected a plurality of times.

Moreover, the resin is more likely to reach bonding pads present at the end of the first semiconductor chip on the resin-injected side than to reach bonding pads present on the other end. Hence, the distance from the end of the second semiconductor chip to those bonding pads needs to be at a certain value or greater.

The present invention has been made in view of the above-described situation, and an object thereof is to provide a method of manufacturing a semiconductor device which can reduce the number of times of resin-injection, thereby facilitating the miniaturization of the semiconductor device, and the semiconductor device.

In order to achieve the above object, according to the present invention, there is provided a method of manufacturing a semiconductor device, comprising preparing a first semiconductor chip having a wire face and at least two second semiconductor chips having a wire face and smaller than the first semiconductor chip; placing the at least two second semiconductor chips in parallel apart along the wire face of the first semiconductor chip and flip-chip joining the wire faces of the first and second semiconductor chips; injecting a fill fluid into a space between the second semiconductor chips and spaces between the first semiconductor chip and the second semiconductor chips flip-chip joined; and hardening the fill fluid. In the fill fluid injecting step, the fill fluid is injected into the space between the second semiconductor chips through an injection opening of an outlet diameter smaller than the distance between the second semiconductor chips.

In the fill fluid injecting step, while moving the injection opening along the space between the second semiconductor chips, the fill fluid may be injected into the space between the second semiconductor chips through the injection opening.

Further, in the fill fluid injecting step, the speed of movement of the injection opening may be changed according to at least one of viscosity of the fill fluid and the position of the injection opening relative to the space between the second semiconductor chips.

Yet further, in the fill fluid injecting step, the height of the injection opening relative to the first semiconductor chip may be adjusted according to viscosity of the fill fluid.

Still further, in the fill fluid injecting step, the injection amount of the fill fluid may be adjusted according to at least one of viscosity of the fill fluid and the position of the injection opening relative to the space between the second semiconductor chips.

In the step of placing and flip-chip joining, with the distance between the second semiconductor chips set to range from 0.6 mm to 0.9 mm, the second semiconductor chips may be joined to the first semiconductor chip.

Further, in the step of placing and flip-chip joining, with distances from bonding pads provided near the outer edge on the wire face of the first semiconductor chip to the side surfaces of the second semiconductor chips set at 0.5 mm or less, the second semiconductor chips may be joined to the first semiconductor chip.

In order to achieve the above object, there is provided a semiconductor device, comprising a first semiconductor chip having a wire face; at least two second semiconductor chips smaller than the first semiconductor chip and placed apart along and joined to the wire face of the first semiconductor chip; and under-fill resin injected in a space between the second semiconductor chips and spaces between the first semiconductor chip and the second semiconductor chips, wherein the thickness of a layer of the under-fill resin is greatest in the space between the second semiconductor chips.

The distance between the second semiconductor chips may range from 0.6 mm to 0.9 mm.

Further, the first semiconductor chip may have bonding pads near the outer edge of the wire face. Yet further, the distance between the second semiconductor chips may be longer than distances from the bonding pads to the side surfaces of the second semiconductor chips.

Still further, a protrusion may be formed inward of the bonding pads and along the area where the bonding pads are formed. Further, the distances from the bonding pads to the side surfaces of the second semiconductor chips may be equal to or less than 0.5 mm.

In the method of manufacturing a semiconductor device and the semiconductor device according to the present invention, after resin is injected into a space between at least two second semiconductor chips flip-chip joined to a first semiconductor chip through an injection opening, the resin is hardened, and thereby a reduction in number of times of resin-injection and the miniaturization of the semiconductor device can be achieved.

DETAILED DESCRIPTION OF THE PREFERRED EMBODIMENT

Figure 1:
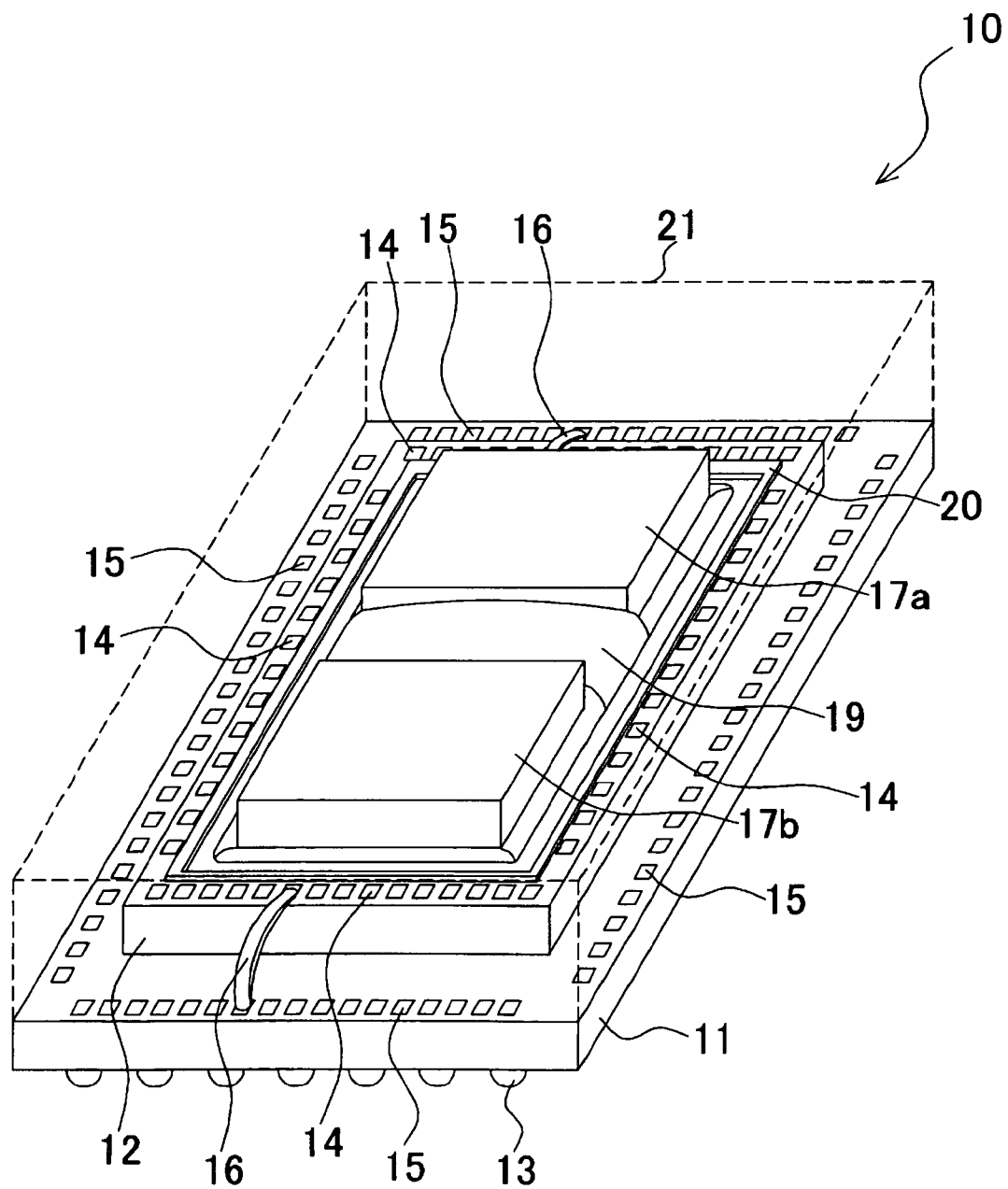
FIG. 1 is a perspective view of a semiconductor device as an embodiment of the present invention.
Figure 2:
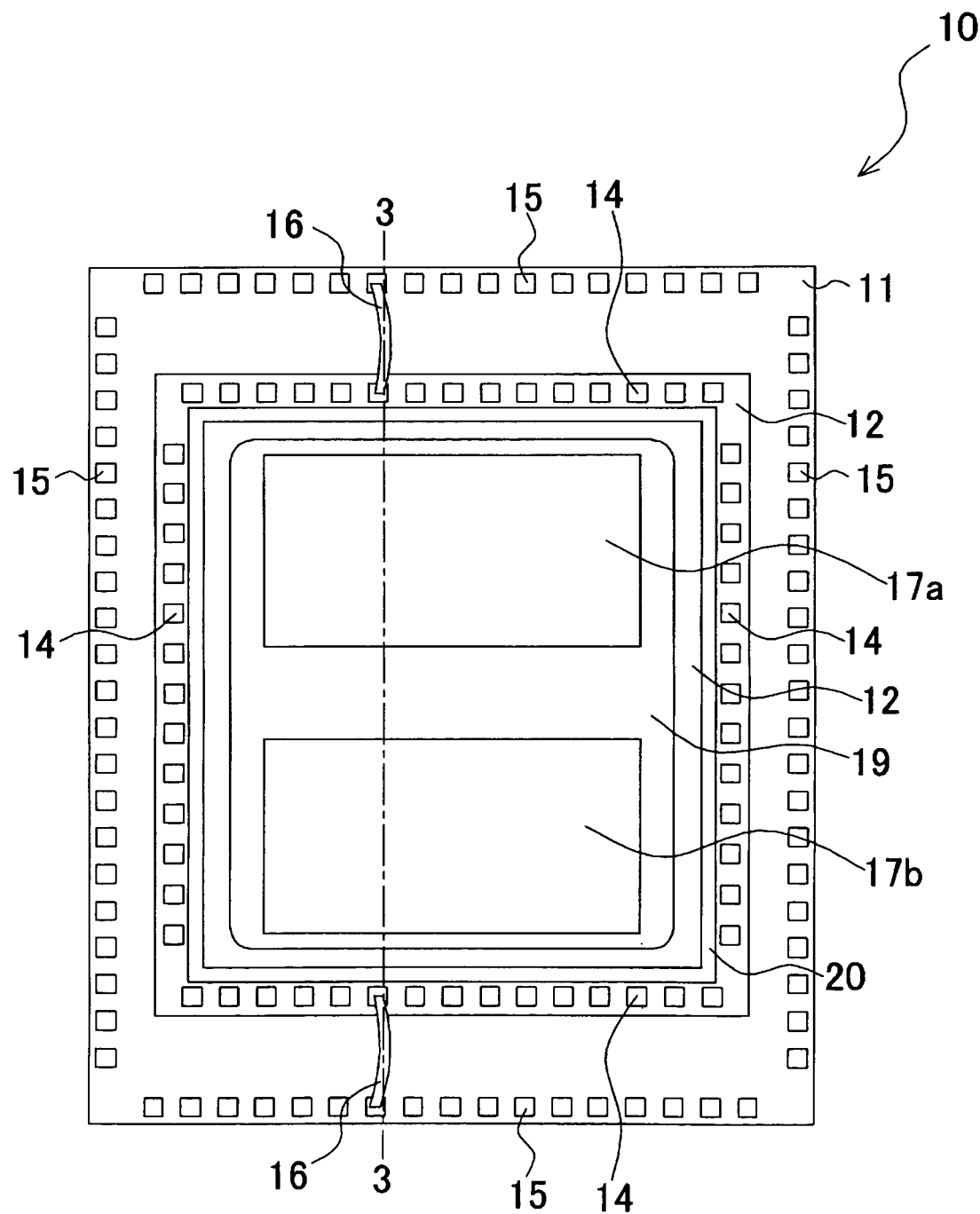
FIG. 2 is a plan view of the semiconductor device as the embodiment of the present invention.
Figure 3:
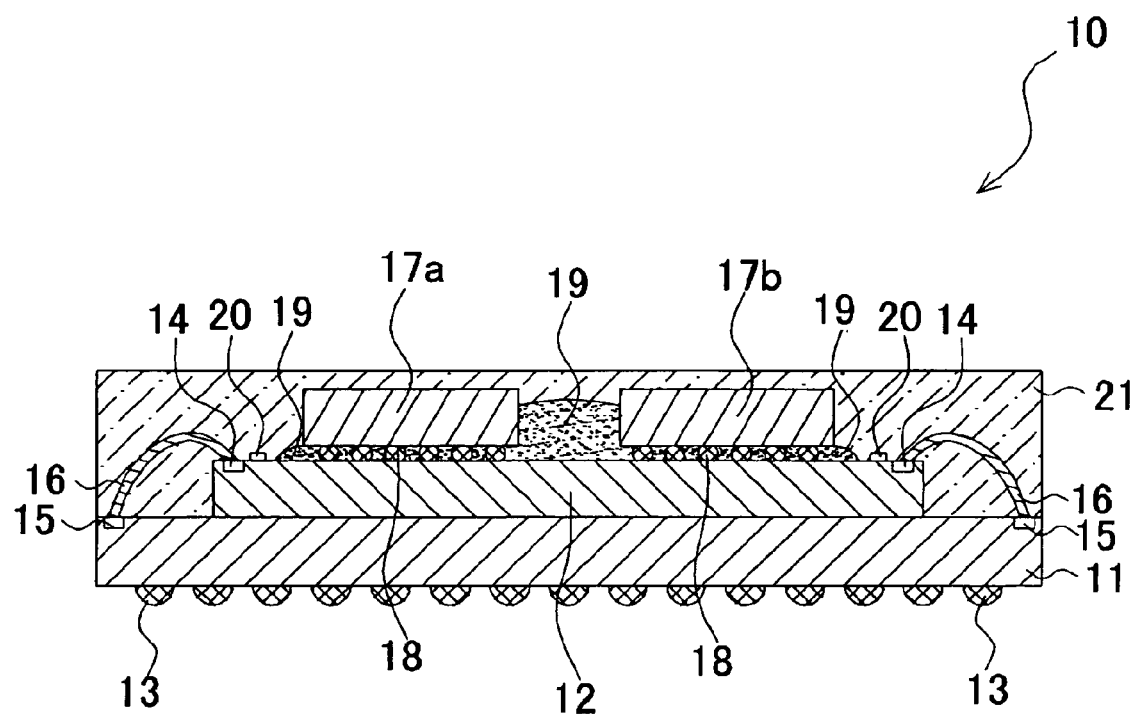
FIG. 3 is a sectional view taken along dot-dashed line 3-3 in FIG. 2.

An embodiment of the present invention will be described in detail below with reference to the accompanying drawings.
[Embodiment]
First, a semiconductor device 10 as an embodiment of the present invention will be described in detail with reference to FIGS. 1 to 3.

In the semiconductor device 10, a first semiconductor chip 12 is fixed on a substrate 11 of, e.g., silicon or sapphire by adhesive (not shown). On the opposite side of the substrate 11 from the fixed first semiconductor chip 12 (i.e., the back side), there are fixed multiple solder balls at predetermined positions with which the semiconductor device 10 is electrically connectable to an apparatus.

On a main face of the first semiconductor chip 12 that is its side not fixed to the substrate 11, there is formed at least circuitry (not shown) of which electrodes are exposed and multiple bonding pads 14. Hereinafter, this main face is referred to as a wire face. The bonding pads 14 are formed on the periphery of the wire face of the first semiconductor chip 12 and electrically connected to bonding posts 15 formed on the upper periphery of the substrate 11 by Au wires 16. In FIGS. 1 to 3, only two wirings by Au wires 16 are shown, but not being limited to this, desired wiring can be carried out according to the need by the semiconductor device 10, circuit settings, etc. Note that semiconductor chips cited herein include not only ones having devices including active elements such as transistors and passive elements such as resistors and filters but also ones on whose main face only wire patterns of electrodes and wires are formed. Thus, in this specification, semiconductor chips include a silicon substrate or a glass epoxy substrate having only wire patterns thereon as well.

Two second semiconductor chips 17a, 17b smaller in size than the first semiconductor chip 12 are flip-chip joined to the wire face of the first semiconductor chip 12 via a plurality of bond members 18. Namely, the main faces of the second semiconductor chips 17a, 17b on which at least circuitry (not shown) having electrodes exposed is formed (hereinafter called wire faces) are opposite the wire face of the first semiconductor chip 12. The bond members 18 may be of eutectic solder, Sn—Ag+Ni or Au and connect electrodes of the circuitry of the first semiconductor chip 12 and electrodes of the circuitry of the second semiconductor chips 17a, 17b. Note that the second semiconductor chips 17a, 17b may be different in size and characteristics or may be the same.

The distance between the first semiconductor chip 12 and the second semiconductor chips 17a, 17b desirably ranges from 10 μm to 50 μm. The second semiconductor chips 17a, 17b are desirably apart by a distance of 0.6 mm to 0.9 mm. The reason why this distance range is desirable is that if the distance between the second semiconductor chips 17a, 17b is less than 0.6 mm, it is difficult to insert a needle described later and that if greater than 0.9 mm, it is difficult to inject a resin into the spaces between the first semiconductor chip 12 and the second semiconductor chips 17a, 17b. The spaces between the first semiconductor chip 12 and the second semiconductor chips 17a, 17b and the space between the second semiconductor chips 17a, 17b are filled with an under-fill resin layer 19. The under-fill resin layer 19 is greatest in thickness in the space between the second semiconductor chips 17a, 17b (i.e., the center of the first semiconductor chip 12), and its thickness becomes thinner when going from that space toward the periphery of the first semiconductor chip 12. Further, a protrusion 20 to prevent the under-fill resin layer 19 from flowing into the bonding pads 14 is provided on the main face of the first semiconductor chip 12. Moreover, the distance between the second semiconductor chips 17a, 17b is longer than distances from the bonding pads 14 to the side surfaces of the second semiconductor chips 17a, 17b. The distances from the bonding pads 14 to the side surfaces of the second semiconductor chips 17a, 17b are desirably equal to or less than 0.5 mm.

The main face of the substrate 11, the first semiconductor chip 12, the second semiconductor chips 17a, 17b, and the under-fill resin layer 19 are covered by a seal resin layer 21. The seal resin layer 21 is denoted by broken lines in FIG. 1.

Next, the method of manufacturing the semiconductor device according to the embodiment of the present invention will be described in detail with reference to FIGS. 4A to 4E.

Figure 4A:
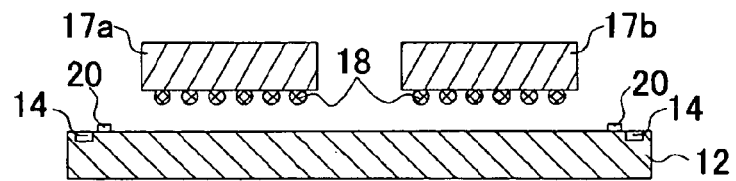
FIGS. 4A to 4E are sectional views of the semiconductor device as the embodiment of the present invention for respective manufacturing processes.

First, there are prepared the first semiconductor chip 12 that has at least circuitry with electrodes exposed, the bonding pads 14, and the protrusion 20 on its main face, and the second semiconductor chips 17a, 17b that have at least circuitry with electrodes exposed and the bond members 18 fixed to the exposed electrodes on their main face (FIG. 4A).

Figure 4B:
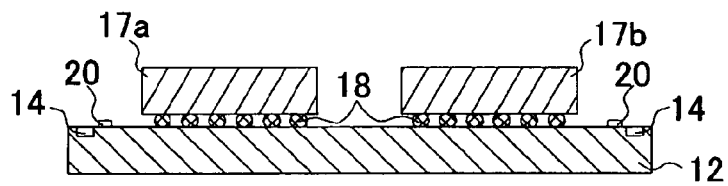

Then, the wire faces of the second semiconductor chips 17a, 17b are made to be opposite the wire face of the first semiconductor chip 12 and flip-chip joined with there being spaces of 10 μm to 50 μm between the first semiconductor chip 12 and the second semiconductor chips 17a, 17b (FIG. 4B). The second semiconductor chips 17a, 17b are placed in parallel apart by a space of 0.6 mm to 0.9 mm above the wire face of the first semiconductor chip 12. These spaces vary depending on the size or the like of the semiconductor device to be produced.

Figure 4C:
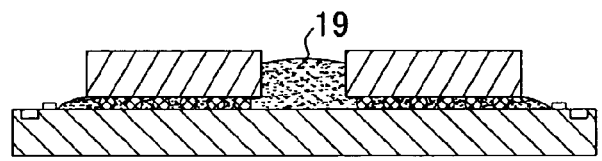

Then, the under-fill resin is injected through the space between the second semiconductor chips 17a, 17b to fill the spaces between the first semiconductor chip 12 and the second semiconductor chips 17a, 17b and the space between the second semiconductor chips 17a, 17b with the under-fill resin, thus forming the under-fill resin layer 19 (FIG. 4C). The under-fill resin is desirably, for example, of an epoxy-based thermosetting type.

The injection process for the under-fill resin will be described in detail with reference to FIGS. 5A, 5B.

Figure 5A:
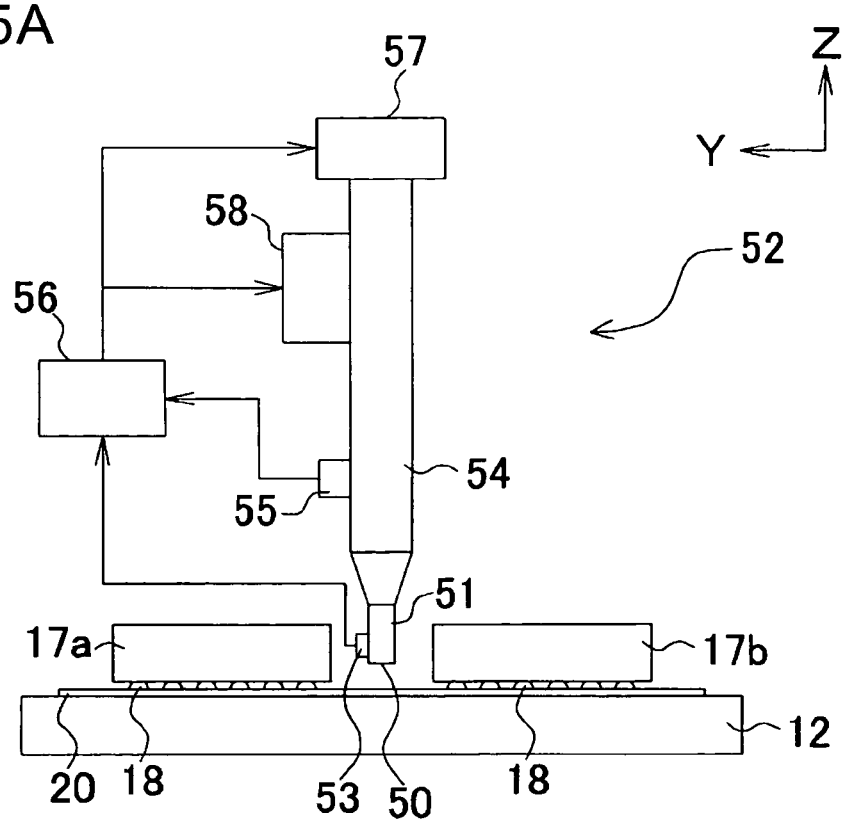
FIG. 5A is a configuration diagram of a resin injection apparatus and the semiconductor device as the embodiment of the present invention.
Figure 5B:
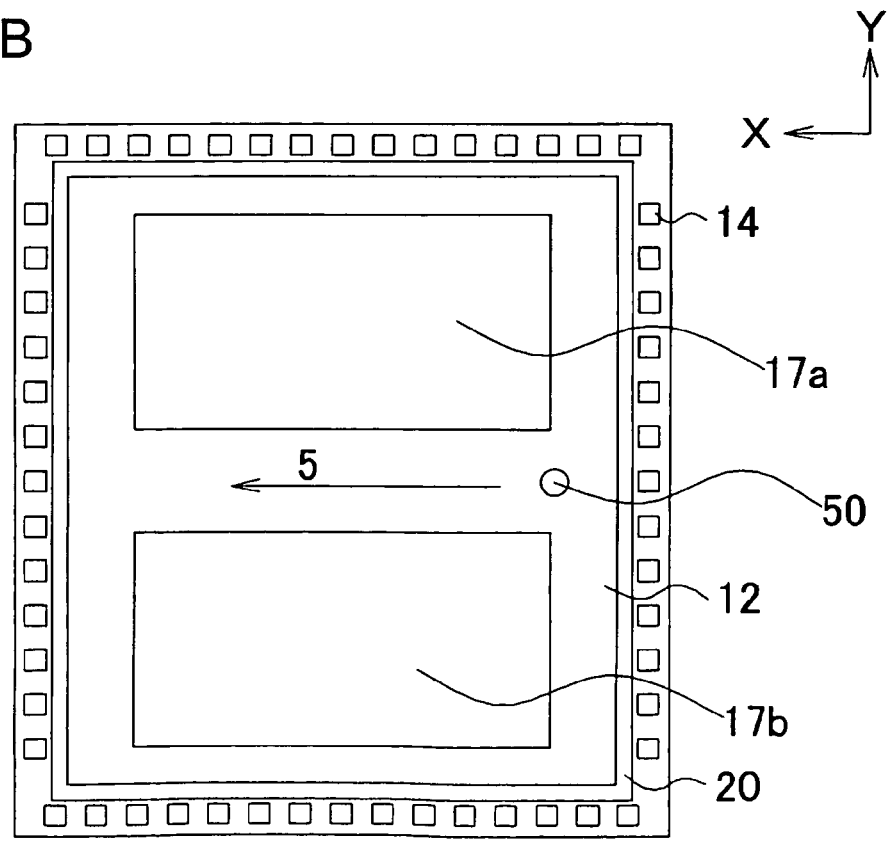
FIG. 5B is a plan view of the semiconductor device as the embodiment of the present invention in a resin injection process.

As shown in FIG. 5A, the under-fill resin is injected according to a dispense method with use of a resin injection apparatus 52 provided at its end with a needle 51 having an injection opening 50 (i.e., an outlet) of 0.2 to 0.5 mm in outlet diameter. The outlet diameter of the injection opening 50 may be outside the above value range as long as being smaller than the space between the second semiconductor chips 17a, 17b.

The resin injection apparatus 52 is provided at its end with an injection amount detecting sensor 53 to detect the injection amount of under-fill resin. A position sensor 55 to detect the position in X-axis, Y-axis, and Z-axis directions of the injection opening 50 is provided on the side of a storage portion 54 of the resin injection apparatus 52 storing the under-fill resin. The injection amount detecting sensor 53 and the position sensor 55 are connected to a control apparatus 56 and transmit an injection amount signal and a position signal to the control apparatus 56. The control apparatus 56 is connected to a resin adjustment portion 57 for adjusting the injection amount of under-fill resin and a positioning mechanism 58 for positioning the injection opening 50 and the resin injection apparatus 52. For example, the positioning mechanism 58 may be formed of a drive motor and a rack-pinion. The control apparatus 56 is provided with an input unit (not shown) such as a keyboard for entering characteristics such as viscosity of the injected resin.

The control apparatus 56 controls the positioning mechanism 58 to position the injection opening 50 above one end of the first semiconductor chip 12 (i.e., its right end in FIG. 5B) in the space between the second semiconductor chips 17a, 17b with positioning the injection opening 50 in height (in the Z-axis direction) as well.

After the completion of the positioning, the control apparatus 56 controls the positioning mechanism 58 to move the injection opening 50 in the X-axis direction (i.e., along the arrow 5) in the space between the second semiconductor chips 17a, 17b. Further, with controlling that movement, the control apparatus 56 controls the resin adjustment portion 57 to inject a predetermined amount of under-fill resin.

Moreover, the control apparatus 56 may control the positioning mechanism 58 to set the speed of movement of the injection opening 50 according to the position of the injection opening 50 (e.g., a position relative to the space between the second semiconductor chips 17a, 17b) received from the position sensor 55 or the entered resin viscosity. Specifically, the speed of movement may be made slower at positions near the protrusion 20, and as going toward the center of the first semiconductor chip 12, the speed of movement may be made faster, and as approaching the protrusion 20 again, the speed of movement may be made slower.

Further, the control apparatus 56 may control the positioning mechanism 58 to set the height (position in the Z-axis direction) of the injection opening 50 according to the entered resin viscosity.

In addition, the control apparatus 56 may control the resin adjustment portion 57 to adjust the amount of under-fill resin injected through the injection opening 50 according to the position of the injection opening 50 (e.g., a position relative to the space between the second semiconductor chips 17a, 17b) received from the position sensor 55 or the entered resin viscosity. Specifically, the injection amount may be increased for parts where under-fill resin is less likely to spread.

As described above, by injecting the under-fill resin through the space between the second semiconductor chips 17a, 17b, the thickness of the resin measured from the first semiconductor chip 12 is greatest in between the second semiconductor chips 17a, 17b and decreases when going toward the protrusion 20. Also, by injecting the under-fill resin through the space between the second semiconductor chips 17a, 17b, both the spaces between the first semiconductor chip 12 and the second semiconductor chips 17a, 17b are filled with almost the same amount of under-fill resin. In the conventional art, since being injected from the side, the resin does not reach the other end with one time injection, and hence a plurality of times of injection are necessary, but in the present embodiment, it is possible to fill the under-fill resin with one time injection. Further, because both the spaces between the first semiconductor chip 12 and the second semiconductor chips 17a, 17b are filled with almost the same amount of it, the under-fill resin does not flow into the bonding pads 14, and hence an extra space (in case resin flows out) need not be provided on the first semiconductor chip 12, and thus the semiconductor device 10 can be made smaller.

Figure 4D:
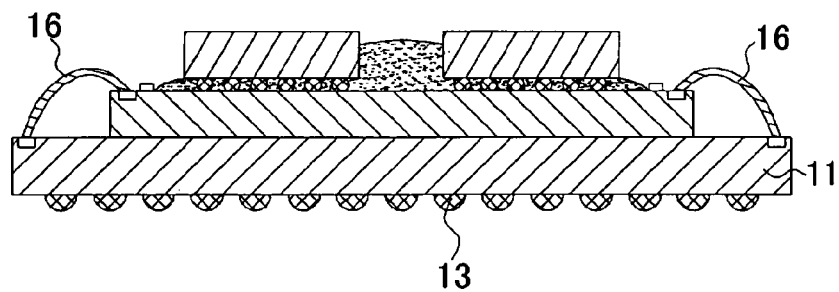

After the injection process for the under-fill resin, heating is performed in a hardening furnace to harden the under-fill resin to form the under-fill resin layer 19. Thereafter, the first semiconductor chip 12 is fixed by adhesive to the main face of the substrate 11 having solder balls 13 fixed on its back side, and bonding pads 14 and bonding posts 15 are electrically connected by Au wires 16 (FIG. 4D).

Figure 4E:
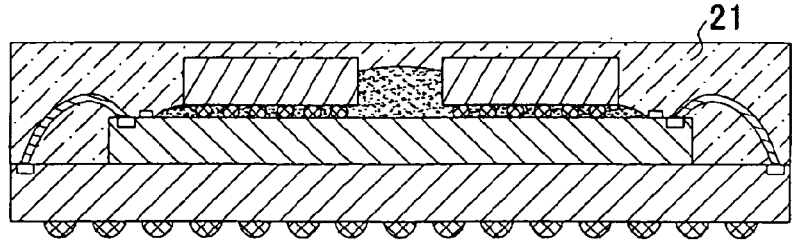

Thereafter, the main face of the substrate 11, the first semiconductor chip 12, the second semiconductor chips 17a, 17b, and the under-fill resin layer 19 are sealed with resin, which forms the seal resin layer 21 (FIG. 4E). The sealed semiconductor device 10 forms a ball grid array (BGA) package.

As described above, according to the method of manufacturing a semiconductor device and the semiconductor device according to the present embodiment, by injecting resin through a space between at least two second semiconductor chips flip-chip joined to the first semiconductor chip, it is possible to fill the resin with one time injection. That is, the time required for the resin injection process can be reduced. Further, without the resin flowing into the bonding pads, the distances from the bonding pads to the second semiconductor chips can be reduced, and thus the semiconductor device can be made smaller.

This application is based on Japanese Patent Application No. 2008-034342 which is hereby incorporated by reference.

What is claimed is:

1. A method of manufacturing a semiconductor device, comprising:
   preparing a first semiconductor chip having a wire face, and at least two second semiconductor chips each having a wire face and each being smaller than said first semiconductor chip, one of the second semiconductor chips having an opposing face that faces an opposing face of another of the second semiconductor chips;
   placing the wire faces of said second semiconductor chips to face towards said wire face of said first semiconductor chip and flip-chip joining said wire faces of said first and second semiconductor chips so that the wire faces of said second semiconductor chips lies on and above said wire face of said first semiconductor chip;
   injecting a fill fluid into a first space that is defined above a level of the wire faces of said second semiconductor chips and between the opposing faces of said one and another second semiconductor chips and into second spaces between the flip-chip joined first semiconductor chip and second semiconductor chips, the fill fluid touching the opposing faces of said one and another second semiconductor chips,
   wherein the fill fluid in the first space has an upper surface that is beneath upper surfaces of the second semiconductor chips;
   hardening said fill fluid; and
   after said hardening, sealing the first and second semiconductor chips with a sealing resin, wherein during said injecting, said fill fluid is injected into the first and second spaces through an injection opening of an outlet, having a diameter smaller than a distance between said second semiconductor chips, such that almost a same amount of fill fluid is injected into each respective said second space.

2. A method of manufacturing a semiconductor device according to claim 1, wherein in said fill fluid injecting step, while moving said injection opening along said first space, said fill fluid is injected into said first space through said injection opening.

3. A method of manufacturing a semiconductor device according to claim 1, wherein in said fill fluid injecting step, the speed of movement of said injection opening is changed according to at least one of viscosity of said fill fluid and the position of said injection opening relative to said first space.

4. A method of manufacturing a semiconductor device according to claim 1, wherein in said fill fluid injecting step, the height of said injection opening relative to said first semiconductor chip is adjusted according to viscosity of said fill fluid.

5. A method of manufacturing a semiconductor device according to claim 1, wherein in said fill fluid injecting step, the injection amount of said fill fluid is adjusted according to at least one of viscosity of said fill fluid and the position of said injection opening relative to said first space.

6. A method of manufacturing a semiconductor device according to claim 1, wherein in said step of placing and flip-chip joining, with the distance between said second semiconductor chips set to range from 0.6 mm to 0.9 mm, said second semiconductor chips are joined to said first semiconductor chip.

7. A method of manufacturing a semiconductor device according to claim 1, wherein in said step of placing and flip-chip joining, with distances from bonding pads provided near an outer edge on said wire face of said first semiconductor chip to the side surfaces of said second semiconductor chips set at 0.5 mm or less, said second semiconductor chips are joined to said first semiconductor chip.

8. A method of manufacturing a semiconductor device according to claim 1, wherein after the injecting, the thickness of the fill fluid measured from the wire face of said first semiconductor chip is greatest at a point in said first space.

9. A method of manufacturing a semiconductor device according to claim 1, wherein after the injecting, the thickness of the fill fluid measured from the wire face of said first semiconductor chip decreases toward a periphery of said first semiconductor chip.

10. A method of manufacturing a semiconductor device according to claim 1, wherein for each of the one and another second semiconductor chips the respective wire face and opposing face are perpendicular to each other.

* * * * *